US012575161B2

(12) United States Patent
Fu et al.

(10) Patent No.: US 12,575,161 B2
(45) Date of Patent: Mar. 10, 2026

(54) SEMICONDUCTOR DEVICE AND FABRICATION METHOD THEREOF

(71) Applicant: Vanguard International Semiconductor Corporation, Hsinchu (TW)

(72) Inventors: Sheng-Wei Fu, Taoyuan City (TW); Chung-Yen Chien, Taoyuan City (TW); Chung-Yeh Lee, Hsinchu County (TW); Fu-Hsin Chen, Hsinchu County (TW); Chen-Dong Tzou, Taipei City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 399 days.

(21) Appl. No.: 18/382,536

(22) Filed: Oct. 23, 2023

(65) Prior Publication Data

US 2025/0133802 A1      Apr. 24, 2025

(51) Int. Cl.
H10D 64/23          (2025.01)
H01L 21/762          (2006.01)
(Continued)

(52) U.S. Cl.
CPC ..... H10D 64/252 (2025.01); H01L 21/76224 (2013.01); H10D 30/025 (2025.01);
(Continued)

(58) Field of Classification Search
CPC ......... H01L 21/76224; H01L 21/76264; H01L 21/763; H01L 21/762; H10D 30/01;
(Continued)

(56)              References Cited

U.S. PATENT DOCUMENTS

| | | | | |
|---|---|---|---|---|
| 6,140,678 A | * | 10/2000 | Grabowski | .......... H10D 30/668 |
| | | | | 257/E29.066 |
| 2005/0280079 A1 | * | 12/2005 | Jones | ................... H10D 64/252 |
| | | | | 257/330 |

(Continued)

FOREIGN PATENT DOCUMENTS

| | | |
|---|---|---|
| CN | 105702722 A | 6/2016 |
| EP | 1 041 638 A1 | 10/2000 |

(Continued)

*Primary Examiner* — Brook Kebede
(74) *Attorney, Agent, or Firm* — Winston Hsu

(57)              ABSTRACT

A semiconductor device includes a substrate having a first conductivity type and an epitaxial layer disposed on the substrate. A first trench and a second trench are disposed in the epitaxial layer. A first body region and a second body region both having a second conductivity type are disposed in the epitaxial layer, and located on two sides of the first trench, respectively. A first source region and a second source region both having the first conductivity type are disposed on the first body region and the second body region, respectively. A first electrode is disposed in the first trench. A source contact structure includes a first portion disposed in the first trench and is electrically connected to the first source region and the second source region. A first gate is disposed in the second trench.

20 Claims, 9 Drawing Sheets

(51) Int. Cl.
    *H10D 30/01*       (2025.01)
    *H10D 30/63*       (2025.01)
    *H10D 62/10*       (2025.01)
    *H10D 64/27*       (2025.01)

(52) U.S. Cl.
    CPC ............. *H10D 30/63* (2025.01); *H10D 62/10* (2025.01); *H10D 64/513* (2025.01)

(58) Field of Classification Search
    CPC ............ H10D 30/025; H10D 30/0291; H10D 30/0295; H10D 30/0297; H10D 30/0318; H10D 30/63; H10D 30/66; H10D 30/668; H10D 30/6728; H10D 30/689; H10D 30/693; H10D 62/10; H10D 64/117; H10D 64/23; H10D 64/252; H10D 64/27; H10D 64/513
    See application file for complete search history.

(56)             References Cited

U.S. PATENT DOCUMENTS

2008/0035987 A1\*   2/2008   Hebert ................. H10D 30/664
                                            257/330
2016/0372538 A1   12/2016   Jin
2021/0226041 A1   7/2021   Yilmaz
2022/0223708 A1\*   7/2022   Su ........................ H10D 62/107

FOREIGN PATENT DOCUMENTS

TW        202040652 A     11/2020
WO     2007/129261 A2   11/2007

\* cited by examiner

SEMICONDUCTOR DEVICE AND FABRICATION METHOD THEREOF

BACKGROUND OF THE INVENTION

1. Field of the Invention

The present disclosure relates generally to semiconductor technology, and in particular to a semiconductor device including trench power transistors and a fabrication method thereof.

2. Description of the Prior Art

Power transistors are usually used in power electronic systems as power switches, converters and other power components. Metal-oxide-semiconductor field-effect-transistors (MOSFETs) are common power transistors, which may include a horizontal structure such as a laterally-diffused metal-oxide-semiconductor (LDMOS) field-effect-transistor (FET), and a vertical structure such as a planar gate MOSFET or a trench gate MOSFET. In the trench gate MOSFET, a gate is disposed in a trench. Compared with the planar gate MOSFET, the trench gate MOSFET has several advantages of avoiding the junction field-effect-transistor (JFET) effect, reducing the surface area of a chip, and reducing the parasitic capacitance. However, conventional trench gate MOSFETs still cannot fully satisfy the various requirements for power electronic applications, such as the requirements of the on-state resistance (Ron), the breakdown voltage and miniaturization of the unit size of the components.

SUMMARY OF THE INVENTION

In view of this, the present disclosure provides a semiconductor device and a fabrication method thereof. The semiconductor device includes a source contact structure formed in a trench, thereby reducing the cell pitch of the semiconductor device. There is no need to enhance the accuracy level of photolithography equipment or use complex self-aligned contact processes. Moreover, the specific on-resistance (Rsp) of the semiconductor device is reduced without concern about alignment shift in contacts.

According to an embodiment of the present disclosure, a semiconductor device is provided and includes a substrate, an epitaxial layer, a first trench, a second trench, a first body region, a second body region, a first source region, a second source region, a first electrode, a source contact structure and a first gate. The substrate has a first conductivity type and the epitaxial layer is disposed on the substrate. The first trench and the second trench are disposed in the epitaxial layer. The first body region and the second body region both having a second conductivity type are disposed in the epitaxial layer, and located on two sides of the first trench, respectively. The first source region and the second source region both having the first conductivity type are disposed on the first body region and the second body region, respectively. The first electrode is disposed in the first trench. The source contact structure includes a first portion disposed in the first trench and is electrically connected to the first source region and the second source region. In addition, the first gate is disposed in the second trench.

According to an embodiment of the present disclosure, a method of fabricating a semiconductor device is provided and includes the following steps. A substrate having a first conductivity type is provided, and an epitaxial layer is formed on the substrate. A first trench is formed in the epitaxial layer, and a first electrode is formed in the first trench. A first body region and a second body region both having a second conductivity type are formed in the epitaxial layer and located on two sides of the trench, respectively. A first source region and a second source region both having the first conductivity type are formed on the first body region and the second body region, respectively. In addition, a source contact structure is formed, at least partially in the first trench, and electrically connected to the first source region and the second source region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
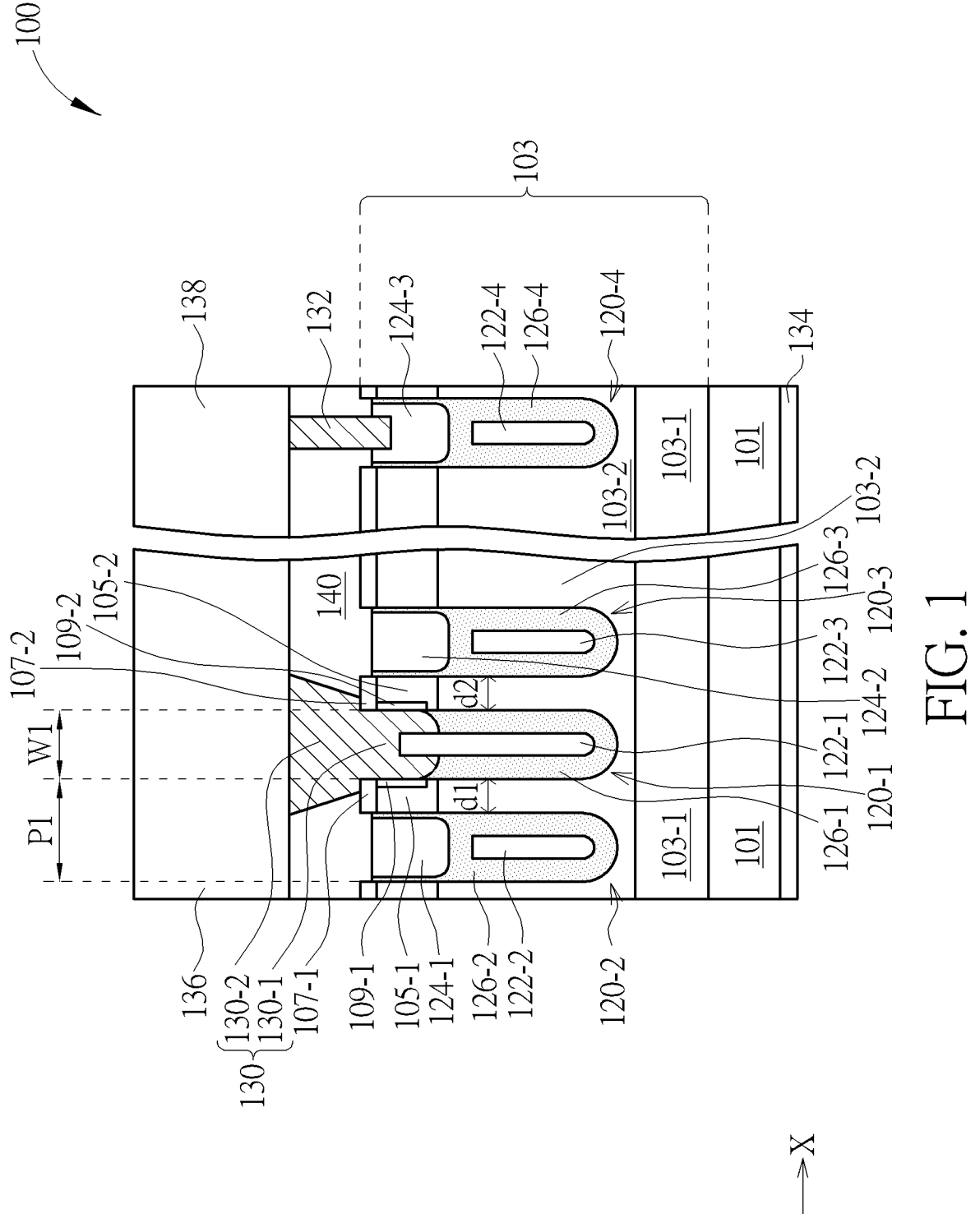
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a semiconductor device including trench gate MOSFETs and a fabrication method thereof. In the semiconductor device, a source contact structure is formed in a trench to electrically connect to two source regions located on two sides of the trench. There is no need to reserve space for a source contact between adjacent trenches, so that the cell pitch of the semiconductor device is greatly reduced, thereby reducing the specific on-resistance (Rsp) of the semiconductor device. According to embodiments of the present disclosure, there is no need to enhance the accuracy level of photolithography equipment or use complex self-aligned contact processes to complete the fabrication of the source contact structure. The source contact structure is formed in the trench, thereby reducing both the cell pitch and the Rsp of the semiconductor device. In the embodiments of the present disclosure, the fabrication of the source contact structure is compatible with the processes of fabricating the trench gate MOSFETs, thereby reducing the process steps and the costs of fabricating the semiconductor device.

FIG. 1 is a schematic cross-sectional view of a semiconductor device 100 according to an embodiment of the present disclosure. The semiconductor device 100 includes a substrate 101. The composition of the substrate 101 may be silicon (Si), silicon carbide (Sic), aluminum nitride (AlN), gallium nitride (GaN) or other suitable semiconductor materials. The substrate 101 has a first conductivity type such as an N-type. In some embodiments, the substrate 101 is, for example, an N-type heavily doped region (N$^+$). A first epitaxial layer 103-1 and a second epitaxial layer 103-2 both having the first conductivity type are disposed on the substrate 101 from bottom to top in sequence. The first epitaxial layer 103-1 and the second epitaxial layer 103-2 may be collectively referred to as an epitaxial layer 103, for example, an N-type epitaxial layer. The doping concentration of the substrate 101 is higher than that of the epitaxial layer 103, and the doping concentration of the first epitaxial layer 103-1 may be higher than that of the second epitaxial layer 103-2. In some embodiments, the composition of the first epitaxial layer 103-1 and the second epitaxial layer 103-2 is, for example, silicon carbide (Sic) or other suitable semiconductor materials.

As shown in FIG. 1, the semiconductor device 100 includes a first trench 120-1 disposed in the epitaxial layer 103. A first electrode 122-1 and a dielectric liner 126-1 are disposed in the first trench 120-1. The dielectric liner 126-1 surrounds the first electrode 122-1, and the top surface of the dielectric liner 126-1 is lower than the top surface of the first electrode 122-1. In some embodiments, the composition of the first electrode 122-1 is, for example, polysilicon, and the composition of the dielectric liner 126-1 is, for example, silicon oxide, but not limited thereto. The semiconductor device 100 further includes a first body region 105-1 and a second body region 105-2 disposed in the epitaxial layer 103. The first body region 105-1 and the second body region 105-2 both have a second conductivity type such as P-type well regions, and are located on two opposite sides of the first trench 120-1, respectively. In addition, a first source region 107-1 and a second source region 107-2 both have the first conductivity type such as N-type heavily doped region (N$^+$), and are disposed on the first body region 105-1 and the second body region 105-2, respectively.

According to some embodiments of the present disclosure, the semiconductor device 100 includes a source contact structure 130 that includes a first portion 130-1 disposed in the first trench 120-1, and a second portion 130-2 located directly above the first trench 120-1. The second portion 130-2 is connected to the first portion 130-1. In a first direction (for example, an X-axis direction), the width of the second portion 130-2 is greater than the width of the first portion 130-1. The source contact structure 130 is in direct contact with the top surface and the side surfaces of the first source region 107-1 and the top surface and the side surfaces of the second source region 107-2, so as to electrically connect to the first source region 107-1 and the second source region 107-2. Moreover, the bottom surface of the source contact structure 130 is lower than the top surface of the first electrode 122-1. The first portion 130-1 of the source contact structure 130 is in direct contact with the top surface and a portion of the sidewalls of the first electrode 122-1. The bottom surface of the source contact structure 130 is in direct contact with the top surface of the dielectric liner 126-1. The source contact structure 130 is also electrically connected to the first body region 105-1 and the second body region 105-2 through the first portion 130-1. In some embodiments, the bottom surface of the source contact structure 130 may be level with or slightly lower than the bottom surfaces of both the first body region 105-1 and the second body region 105-2.

In some embodiments, the semiconductor device 100 further includes a first doped region 109-1 and a second doped region 109-2 both having the second conductivity type such as P-type heavily doped regions (P$^+$), and located in the first body region 105-1 and the second body region 105-2, respectively. The doping concentrations of the first doped region 109-1 and the second doped region 109-2 both are higher than those of the first body region 105-1 and the second body region 105-2. In some embodiments, the doping concentrations of the first doped region 109-1 and the second doped region 109-2 are about 1E14 to about 1E15 atoms/cm$^3$. The doping concentrations of the first body region 105-1 and the second body region 105-2 are about 1E12 to about 1E13 atoms/cm$^3$. As shown in FIG. 1, the first doped region 109-1 and the second doped region 109-2 are extended vertically along a second direction (for example, a Y-axis direction) from the bottom surfaces of the first source region 107-1 and the second source region 107-2, respectively, downwards to cover the sidewalls of the first portion 130-1 of the source contact structure 130. In one embodiment, the first portion 130-1 of the source contact structure 130 is in direct contact with the first doped region 109-1 and the second doped region 109-2 those have higher doping concentrations, and electrically connected to the first body region 105-1 and the second body region 105-2, thereby further reducing the Rsp of the semiconductor device 100.

Still referring to FIG. 1, the semiconductor device 100 further includes a second trench 120-2, a third trench 120-3 and a fourth trench 120-4 disposed in the epitaxial layer 103. The second trench 120-2 abuts the first body region 105-1, and the third trench 120-3 abuts the second body region 105-2. The fourth trench 120-4 is laterally separated from the third trench 120-3 in the first direction (for example, the X-axis direction). In addition, a first gate 124-1 and a second electrode 122-2 are disposed in the second trench 120-2 and vertically separated from each other in the second direction (for example, the Y-axis direction). A dielectric liner 126-2 is disposed in the second trench 120-2 to surround the first gate 124-1 and the second electrode 122-2, and located between the first gate 124-1 and the second electrode 122-2. Similarly, a second gate 124-2 and a third electrode 122-3 are disposed in the third trench 120-3 and vertically separated from each other. A dielectric liner 126-3 is disposed in the third trench 120-3 to surround the second gate 124-2 and the third electrode 122-3, and located between the second gate 124-2 and the third electrode 122-3. A third gate 124-3 and a fourth electrode 122-4 are disposed in the fourth trench 120-4 and vertically separated from each other. A dielectric liner 126-4 is disposed in the fourth trench 120-4 to surround the third gate 124-3 and the fourth electrode 122-4, and located between the third gate 124-3 and the fourth electrode 122-4. In some embodiments, the top surface of the first electrode 122-1 is higher than all the top surfaces of the second electrode 122-2, the third electrode 122-3 and the fourth electrode 122-4. The first electrode 122-1, the second electrode 122-2, the third electrode 122-3 and the fourth electrode 122-4 may have the same composition, such as polysilicon or other suitable conductive materials. Moreover, the first electrode 122-1, the second electrode 122-2, the third electrode 122-3 and the fourth electrode 122-4 may be electrically coupled to a source electrode or a ground terminal and used as shielding electrodes. In addition, the first gate 124-1, the second gate 124-2 and the third gate 124-3 may have the same composition, such as polysilicon or other suitable conductive materials. The dielectric liners 126-1, 126-2, 126-3 and 126-4 may have the same composition, such as silicon oxide, silicon nitride, silicon oxynitride or a combination thereof, but not limited thereto.

As shown in FIG. 1, the semiconductor device 100 includes a gate contact 132 disposed directly above the fourth trench 120-4 and in direct contact with the third gate 124-3. The bottom surface of the gate contact 132 may be located in the third gate 124-3. In addition, an interlayer dielectric (ILD) layer 140 is disposed to fully cover the epitaxial layer 103. The gate contact 132 and the second portion 130-2 of the source contact structure 130 are located in the ILD layer 140. A source electrode 136 and a gate electrode 138 are located on the front side of the substrate 101 and disposed on the ILD layer 140. The source electrode 136 and the gate electrode 138 may be formed of the same first metal layer. In some embodiments, the composition of the source electrode 136 and the gate electrode 138 is, for example, aluminum copper (AlCu), aluminum (Al), copper (Cu) or other suitable conductive metal materials. The source electrode 136 is electrically connected to the source contact structure 130 and the first electrode 122-1. The gate electrode 138 is electrically connected to the gate contact 132. In some embodiments, the source contact structure 130 and the gate contact 132 have the same composition, such as tungsten (W), aluminum (Al), copper (Cu), aluminum copper (AlCu) or other suitable conductive materials. Moreover, the source contact structure 130 and the gate contact 132 may further include a barrier layer (not shown) that is conformally disposed on the sidewalls and the bottom surfaces of the source contact structure 130 and the gate contact 132. The composition of the barrier layer is, for example, tantalum (Ta), tantalum nitride (TaN), titanium (Ti), titanium nitride (TiN) or other suitable diffusion barrier materials. The semiconductor device 100 further includes a drain electrode 134 disposed on the backside of the substrate 101. The substrate 101 is used as a drain region, and the drain electrode 134 is in direct contact with the substrate 101. In some embodiments, the composition of the drain electrode 134 is, for example, aluminum copper (AlCu), aluminum (Al), copper (Cu) or other suitable conductive metal materials.

According to some embodiments of the present disclosure, the source contact structure 130 is located in and directly above the first trench 120-1, electrically connected to both the first source region 107-1 and the second source region 107-2, and also electrically connected to both the first body region 105-1 and the second body region 105-2. Therefore, there is no need to provide a source contact between the first trench 120-1 and the second trench 120-2. Also, there is no need to provide a source contact between the first trench 120-1 and the third trench 120-3. In the first direction (for example, the X-axis direction), a first distance d1 between the first trench 120-1 and the second trench 120-2, and a second distance d2 between the first trench 120-1 and the third trench 120-3 both are less than a width W1 of the first trench 120-1, thereby greatly reducing a pitch P1 of the adjacent trenches to efficiently reduce the cell pitch of the semiconductor device 100. Therefore, the Rsp is reduced to improve the electrical performances of the semiconductor device 100.

Figure 2:
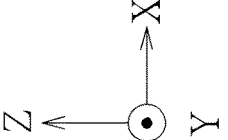
FIG. 2, FIG. 3, FIG. 4, FIG. 5, FIG. 6, FIG. 7 and FIG. 8 are schematic cross-sectional views of some stages of a method of fabricating a semiconductor device according to an embodiment of the present disclosure.

FIG. 2, FIG. 3, FIG. 4, FIG. 5, FIG. 6, FIG. 7 and FIG. 8 are schematic cross-sectional views of some stages of a method of fabricating a semiconductor device 100 according to an embodiment of the present disclosure. Referring to FIG. 2, in step S101, firstly, a substrate 101 is provided with a first conductivity type (for example, an N-type). Then, a first epitaxial layer 103-1 and a second epitaxial layer 103-2 are formed on the substrate 101 from bottom to top in sequence. The compositions of the substrate 101, the first epitaxial layer 103-1 and the second epitaxial layer 103-2 are, for example, silicon carbide (Sic) or other suitable semiconductor materials. The substrate 101 is, for example, an N-type heavily doped region (N⁺), and formed by implanting doping ions of the first conductive type (for example, the N-type) on the backside of a silicon carbide (SiC) wafer through an ion implantation process. The first epitaxial layer 103-1 and the second epitaxial layer 103-2 may be collectively referred to as an epitaxial layer 103, for example, an N-type epitaxial layer. In some embodiments, a silicon carbide (Sic) epitaxial layer is deposited on the substrate 101 through an epitaxial growth process, and doping ions of the first conductive type (for example, the N type) with different doses are added during the epitaxial growth process to form the first epitaxial layer 103-1 and the second epitaxial layer 103-2. The doping concentration of the substrate 101 is higher than that of the epitaxial layer 103. The doping concentration of the first epitaxial layer 103-1 may be higher than that of the second epitaxial layer 103-2.

Still referring to FIG. 2, a first trench 120-1, a second trench 120-2, a third trench 120-3 and a fourth trench 120-4 are simultaneously formed in the epitaxial layer 103 by photolithography and etching processes. The second trench 120-2 and the third trench 120-3 are located on two sides of the first trench 120-1, respectively, and the fourth trench 120-4 is laterally separated from the third trench 120-3. Then, dielectric liners 126-1, 126-2, 126-3 and 126-4 are conformally formed on the sidewalls and the bottom surfaces of the first trench 120-1, the second trench 120-2, the third trench 120-3 and the fourth trench 120-4, respectively, by a deposition process. Afterwards, the first trench 120-1, the second trench 120-2, the third trench 120-3 and the fourth trench 120-4 are filled up with a semiconductor material such as polysilicon. Then, the portions of the semiconductor material in the second trench 120-2, the third trench 120-3 and the fourth trench 120-4 are all etched by an etching back process to form a second electrode 122-2, a third electrode 122-3 and a fourth electrode 122-4, respectively. Next, a dielectric material is deposited in the second trench 120-2, the third trench 120-3, and the fourth trench 120-4 to cover the second electrode 122-2, the third electrode 122-3, and the fourth electrode 122-4. Thereafter, the upper portions of the dielectric liners 126-2, 126-3 and 126-4 are removed by an etching process to form recesses, and then these recesses are filled up with a semiconductor material such as polysilicon to form a first gate 124-1, a second gate 124-2 and a third gate 124-3 those are located directly above the second electrode 122-2, the third electrode 122-3 and the fourth electrode 122-4, respectively. The first gate 124-1 and the second electrode 122-2 are vertically separated from each other and formed in the second trench 120-2. The second gate 124-2 and the third electrode 122-3 are vertically separated from each other and formed in the third trench 120-3. The third gate 124-3 and the fourth electrode 122-4 are vertically separated from each other and formed in the fourth trench 120-4. The gate and the electrode in each trench are surrounded by the dielectric liner and isolated from each other. In the step S101, a mask (not shown) may be formed directly above and to cover the first trench 120-1, so that the semiconductor material 121 and the dielectric liner 126-1 in the first trench 120-1 are prevented from etching.

Thereafter, still referring to FIG. 2, a first body region 105-1 and a second body region 105-2 are formed in the epitaxial layer 103 by an ion implantation process and located on two sides of the first trench 120-1, respectively. At the same time, other body regions are also formed to abut the side surfaces of the other trench. The first body region 105-1, the second body region 105-2 and other body regions all have a second conductivity type such as P-type well regions. Then, a first source region 107-1 and a second source region 107-2 are formed on the first body region 105-1 and the second body region 105-2, respectively, by another ion implantation process. At the same time, other source regions are also formed on the other body regions, respectively. The first source region 107-1, the second source region 107-2 and other source regions all have the first conductivity type such as N-type heavily doped regions (N⁺). Afterwards, an interlayer dielectric (ILD) layer 140 is formed fully on the epitaxial layer 103 by a deposition process to cover the first trench 120-1, the second trench 120-2, the third trench 120-3, the fourth trench 120-4 and each source region. In some embodiments, portions of the ILD layer 140 may be extended into the second trench 120-2, the third trench 120-3 and the fourth trench 120-4. For example, the bottom surfaces of the aforementioned portions of the ILD layer 140 may be level with or slightly higher than the bottom surfaces of the source regions to provide electrical isolation between each gate and each source region. The ILD layer 140 is not extended into the first trench 120-1.

Figure 3:
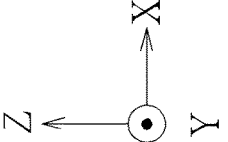

Next, referring to FIG. 3, in step S103, a patterned mask (not shown) is formed on the ILD layer 140, and then a first opening 151 and a second opening 152 are formed in the ILD layer 140 by a first etching process and located directly above the first trench 120-1 and the fourth trench 120-4, respectively. During forming the first opening 151, a portion of the dielectric liner 126-1 in the first trench 120-1 is removed, thereby exposing the top portion of the semiconductor material 121. In some embodiments, the first opening 151 is used as an initial source contact trench, and the second opening 152 is used as a gate contact trench. The initial source contact trench and the gate contact trench are formed simultaneously in the step S103, thereby decreasing the number of the process steps of fabricating the semiconductor device.

Figure 4:
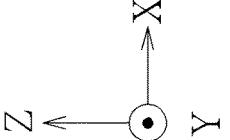

Referring to FIG. 4, in step S105, the patterned mask (not shown) used in the step S103 may be remained, and a second etching process is performed to remove the upper portion of the semiconductor material 121 in the first trench 120-1. As a result, a first electrode 122-1 is formed, and the depth of the first opening 151 is increased. At the same time, a portion of the third gate 124-3 is also removed to increase the depth of the second opening 152. The bottom surface of the second opening 152 is located in the third gate 124-3. Thereafter, a stripping process, such as an ashing or soaking process, may be used to remove the patterned mask used in the step S103 and the step S105.

Figure 5:
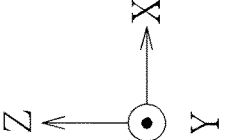

Referring to FIG. 5, in step S107, a patterned mask 160 such as a patterned photoresist is formed to cover the area of the fourth trench 120-4 and fill up the second opening 152. Then, a third etching process is performed to remove the upper portion of the dielectric liner 126-1 in the first trench 120-1 without etching the first electrode 122-1, thereby forming a recess 153 in the first trench 120-1, and expanding the width of the first opening 151 located in the ILD layer 140. After the third etching process, a portion of the top surface of the ILD layer 140 not covered by the patterned mask 160 may be slightly lower than that covered by the patterned mask 160. Moreover, the bottom surface of the recess 153 may be level with or slightly lower than the bottom surfaces of both the first body region 105-1 and the second body region 105-2, and the top surface of the first electrode 122-1 is higher than the bottom surface of the recess 153. Thereafter, the patterned mask 160 is removed by a stripping process.

Figure 6:
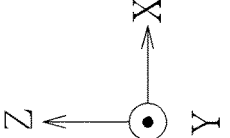

Next, referring to FIG. 6, in step S109, an ion implantation process is performed at an oblique angle through the sidewalls of the recess 153 in the first trench 120-1 to form a first doped region 109-1 and a second doped region 109-2 both having the second conductivity type and located in the first body region 105-1 and the second body region 105-2, respectively. The doping concentrations of the first doped region 109-1 and the second doped region 109-2 both are higher than the doping concentrations of the first body region 105-1 and the second body region 105-2. The first doped region 109-1 and the second doped region 109-2 are extended vertically along the sidewalls of the recess 153 and may completely cover the sidewalls of the recess 153. In some embodiments, the bottom surfaces of the first doped region 109-1 and the second doped region 109-2 may be level with or slightly higher than the bottom surfaces of the first body region 105-1 and the second body region 105-2, which is dependent on the position of the sidewalls of the recess 153.

Figure 7:
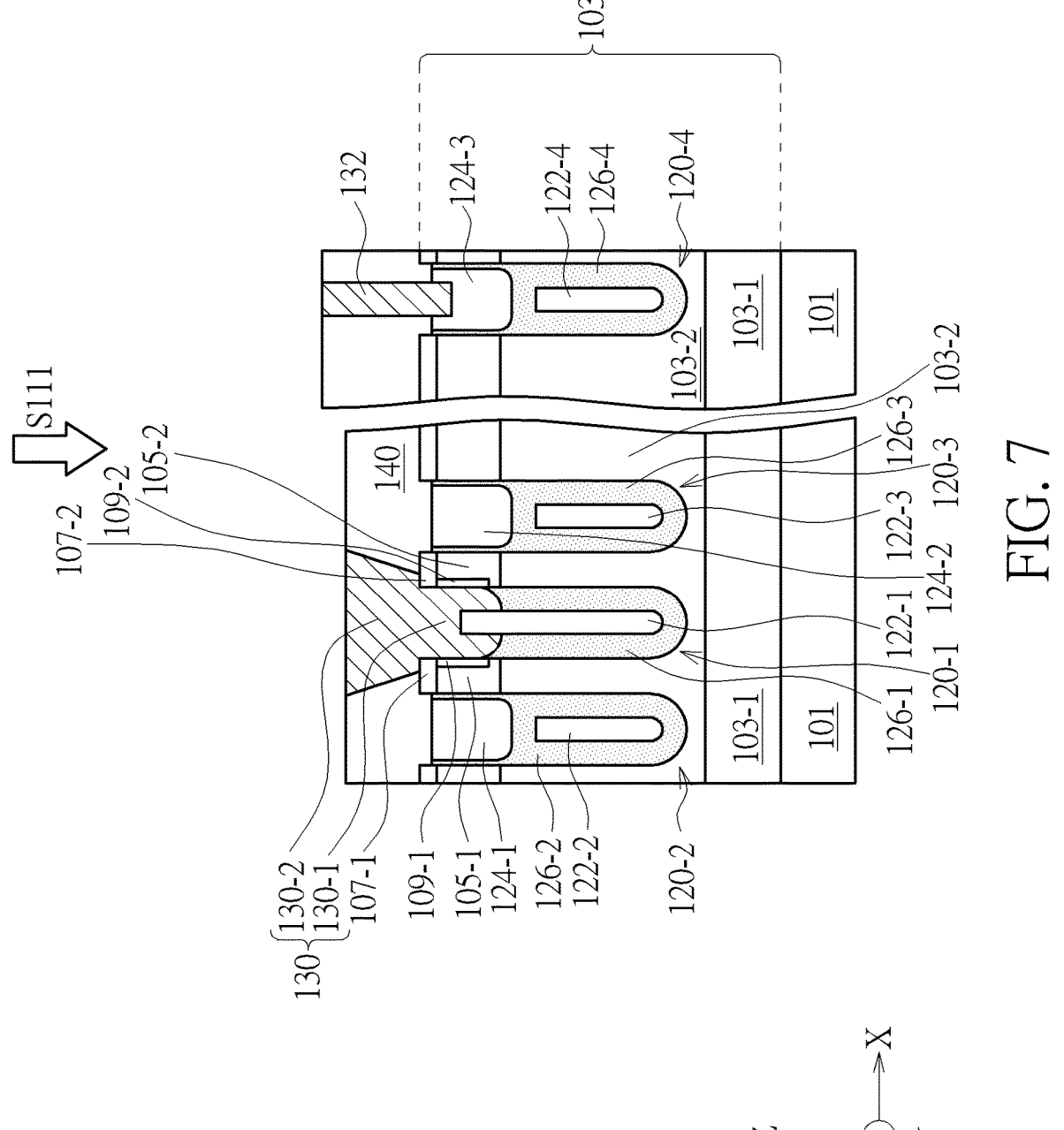

Next, referring to FIG. 7, in step S111, the recess 153, the first opening 151 and the second opening 152 are filled up with a metal conductive material, such as tungsten (W), aluminum (Al), copper (Cu), aluminum copper (AlCu) or other suitable conductive materials by a deposition process and a chemical mechanical planarization (CMP) process to simultaneously form a source contact structure 130 and a gate contact 132. A first portion 130-1 of the source contact structure 130 is formed in the recess 153 of the first trench 120-1, and a second portion 130-2 of the source contact structure 130 is formed in the first opening 151. The width of the second portion 130-2 is greater than the width of the first portion 130-1. The gate contact 132 is formed in the second opening 152, and the bottom surface of the gate contact 132 may be located in the third gate 124-3. In some embodiments, the first portion 130-1 and the second portion 130-2 of the source contact structure 130 both are in direct contact with and electrically connected to both the first source region 107-1 and the second source region 107-2. The first portion 130-1 of the source contact structure 130 is in direct contact with the first doped region 109-1 and the second doped region 109-2 both having a higher doping concentration, and electrically connected to the first body region 105-1 and the second body region 105-2, thereby reducing the Rsp of the semiconductor device. Moreover, the bottom surface of the source contact structure 130 is lower than the top surface of the first electrode 122-1, which is beneficial to reduce the cell pitch of the semiconductor device, and the source contact structure 130 is in direct contact with the first electrode 122-1.

Figure 8:
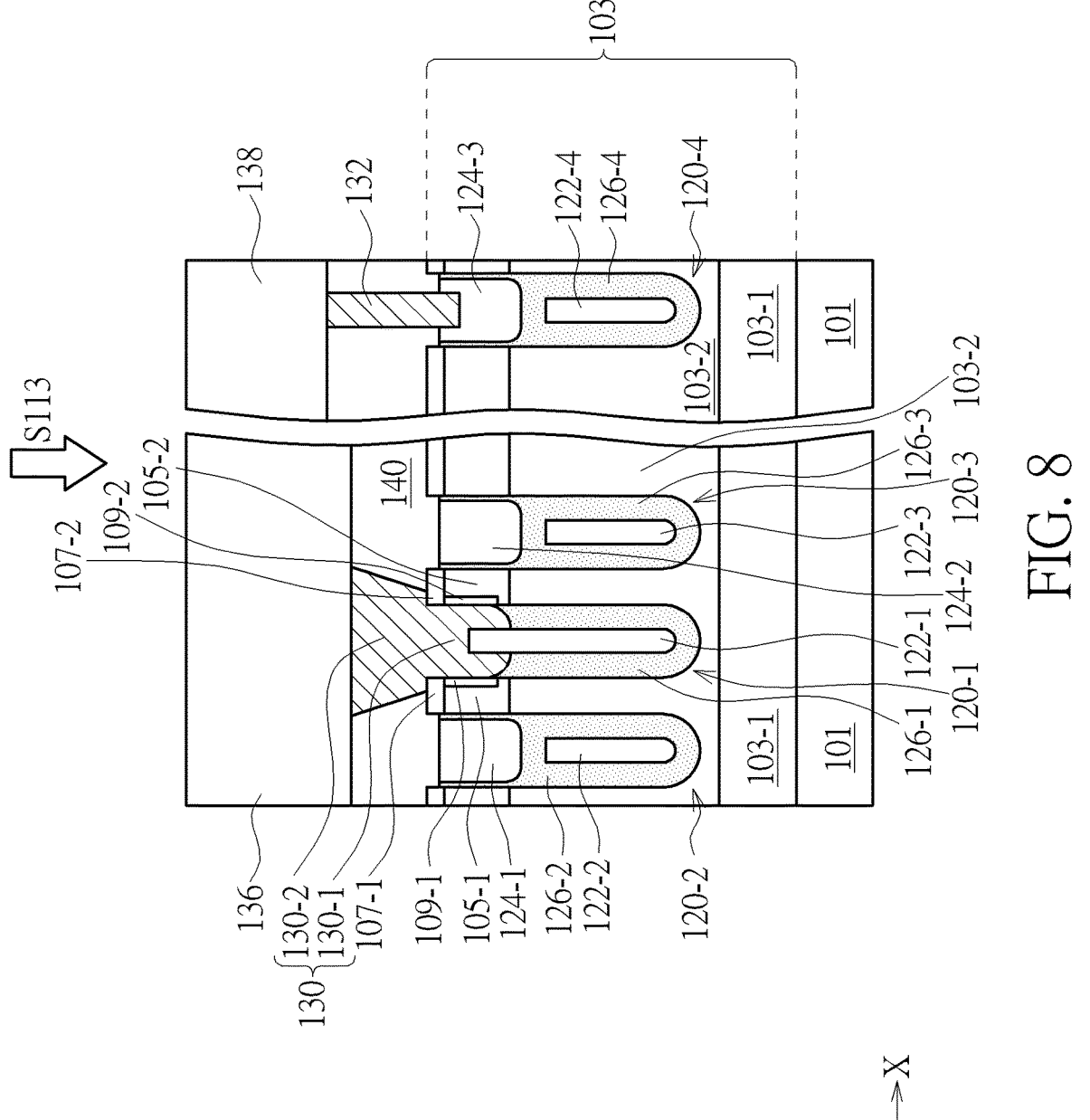

Afterwards, referring to FIG. 8, in step S113, a first metal layer is formed on the ILD layer 140 at the front side of the substrate 101 by deposition and patterning processes. The first metal layer includes a source electrode 136 and a gate electrode 138. The source electrode 136 is electrically connected to the source contact structure 130 and the first electrode 122-1. The gate electrode 138 is electrically connected to the gate contact 132. Then, a drain electrode 134 is formed on the backside of the substrate 101 by another deposition process. The drain electrode 134 is electrically connected to the substrate 101 that is used as a drain region, so as to complete the semiconductor device 100 of FIG. 1.

Figure 9:
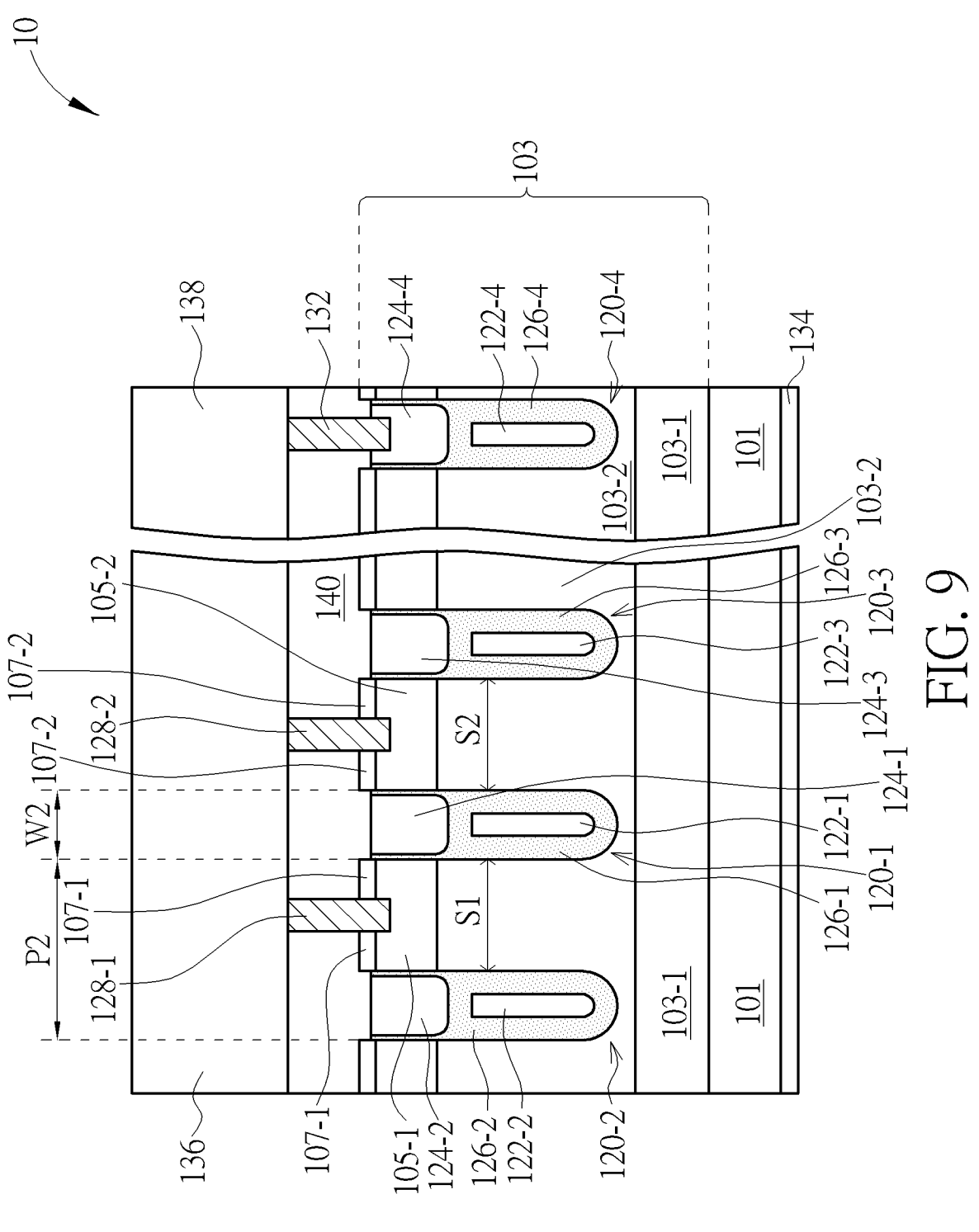
FIG. 9 is a schematic cross-sectional view of a semiconductor device according to a comparative embodiment of the present disclosure.

FIG. 9 is a schematic cross-sectional view of a semiconductor device 10 according to a comparative embodiment of the present disclosure. The semiconductor device 10 of FIG. 9 does not include the source contact structure 130 of the semiconductor device 100 of FIG. 1. In the semiconductor device 10 of FIG. 9, a first gate 124-1 and a first electrode 122-1 are disposed in a first trench 120-1 and vertically separated from each other. A second gate 124-2 and a second electrode 122-2 are disposed in a second trench 120-2 and vertically separated from each other. A third gate electrode 124-3 and a third electrode 122-3 are disposed in a third trench 120-3 and vertically separated from each other. A fourth gate electrode 124-4 and a fourth electrode 122-4 are disposed in a fourth trench 120-4 and vertically separated from each other. Therefore, a source contact 128-1 is required to be disposed between the first trench 120-1 and the second trench 120-2 of the semiconductor device 10, and another source contact 128-2 is also required to be disposed between the first trench 120-1 and the third trench 120-3 of the semiconductor device 10. Compared with the semiconductor device 100 of FIG. 1, the distance S1 between the first trench 120-1 and the second trench 120-2 of the semiconductor device 10 in FIG. 9 is greater than the first distance d1 between the first trench 120-1 and the second trench 120-2 of the semiconductor device 100 in FIG. 1. The distance S2 between the first trench 120-1 and the third trench 120-3 of the semiconductor device 10 in FIG. 9 is also greater than the second distance d2 between the first trench 120-1 and the third trench 120-3 of the semiconductor device 100 in FIG. 1. Moreover, in the first direction (for example, the X-axis direction), the distance S1 and the distance S2 of the semiconductor device 10 in FIG. 9 both are greater than the width W2 of the first trench 120-1. The pitch P2 of the adjacent trenches of the semiconductor device 10 in FIG. 9 is also greater than the pitch P1 of the adjacent trenches of the semiconductor device 100 in FIG. 1. Therefore, compared with the semiconductor device 10 of FIG. 9, the cell pitch of the semiconductor device 100 of FIG. 1 having the source contact structure 130 is effectively reduced, which is beneficial to reduce the specific on-resistance (Rsp), thereby improving the electrical performances of the semiconductor device 100.

According to some embodiments of the present disclosure, the semiconductor device includes a source contact structure located directly above and in a trench, and the source contact structure is electrically connected to two source regions and two body regions located on two sides of the trench. There is no need to reserve space for a source contact between the trench and the adjacent trench, thereby significantly reducing the cell pitch of the semiconductor device, and further reducing the specific on-resistance (Rsp). In addition, according to some embodiments of the present disclosure, the source contact structure is formed without enhancing the accuracy level of the photolithography equipment or using complex self-aligned contact processes. Moreover, the fabrication of the source contact structure is compatible with the processes of fabricating the trench gate MOSFETs, thereby decreasing the number of the process steps and the cost of fabricating the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, having a first conductivity type;
an epitaxial layer, disposed on the substrate;
a first trench and a second trench, disposed in the epitaxial layer;
a first body region and a second body region, both having a second conductivity type, disposed in the epitaxial layer, and located on two sides of the first trench, respectively;
a first source region and a second source region, both having the first conductivity type, and disposed on the first body region and the second body region, respectively;
a first electrode, disposed in the first trench;
a source contact structure, comprising a first portion disposed in the first trench, and electrically connected to the first source region and the second source region; and
a first gate, disposed in the second trench.

2. The semiconductor device of claim 1, wherein a bottom surface of the source contact structure is lower than a top surface of the first electrode, the source contact structure is in direct contact with a portion of sidewalls and the top surface of the first electrode, and the source contact structure is electrically connected to the first body region and the second body region.

3. The semiconductor device of claim 1, further comprising a dielectric liner disposed in the first trench and surrounding the first electrode, wherein a top surface of the dielectric liner is lower than a top surface of the first electrode, and the source contact structure is in direct contact with the top surface of the dielectric liner.

4. The semiconductor device of claim 1, further comprising a first doped region and a second doped region, both having the second conductivity type, and located in the first body region and the second body region, respectively, wherein the source contact structure is in direct contact with the first doped region and the second doped region.

5. The semiconductor device of claim 4, wherein doping concentrations of the first doped region and the second doped region both are higher than doping concentrations of both the first body region and the second body region, and the first doped region and the second doped region are extended vertically from a bottom surface of the first source region and a bottom surface of the second source region, respectively, to cover sidewalls of the source contact structure.

6. The semiconductor device of claim 1, wherein the source contact structure further comprises a second portion located directly above the first trench and connected to the first portion, the second portion has a width greater than a width of the first portion, and the source contact structure is in direct contact with a top surface and a side surface of the first source region, and in direct contact with a top surface and a side surface of the second source region.

7. The semiconductor device of claim 1, wherein the second trench abuts the first body region, in a first direction, a first distance between the first trench and the second trench is less than a width of the first trench.

8. The semiconductor device of claim 1, further comprising:
a second electrode, disposed in the second trench and vertically separated from the first gate.

9. The semiconductor device of claim 8, further comprising:
a third trench, disposed in the epitaxial layer, wherein the third trench abuts the second body region, in a first direction, a second distance between the first trench and the third trench is less than a width of the first trench; and
a second gate and a third electrode, disposed in the third trench and vertically separated from each other, wherein a top surface of the first electrode is higher than a top surface of the second electrode and a top surface of the third electrode.

10. The semiconductor device of claim 9, further comprising:
a fourth trench, disposed in the epitaxial layer and laterally separated from the third trench;
a third gate and a fourth electrode, disposed in the fourth trench and vertically separated from each other; and
a gate contact, in direct contact with the third gate, wherein a bottom surface of the gate contact is located in the third gate.

11. The semiconductor device of claim 1, further comprising:
a drain electrode, disposed on a backside of the substrate and in direct contact with the substrate; and
a source electrode, disposed on a front side of the substrate and electrically connected to the source contact structure and the first electrode.

12. The semiconductor device of claim 1, wherein a bottom surface of the source contact structure is level with or lower than bottom surfaces of both the first body region and the second body region.

13. A method of fabricating a semiconductor device, comprising:
providing a substrate having a first conductivity type;
forming an epitaxial layer on the substrate;
forming a first trench in the epitaxial layer;
forming a first electrode in the first trench;
forming a first body region and a second body region in the epitaxial layer and located on two sides of the first trench, respectively, wherein the first body region and the second body region both have a second conductivity type;
forming a first source region and a second source region on the first body region and the second body region, respectively, wherein the first source region and the second source region both have the first conductivity type; and
forming a source contact structure partially in the first trench and electrically connected to the first source region and the second source region.

14. The method of claim 13, further comprising:
forming a second trench, a third trench and a fourth trench in the epitaxial layer, wherein the second trench and the third trench are located on two sides of the first trench, respectively, and the fourth trench is laterally separated from the third trench;
filling the first trench with a dielectric liner and a semiconductor material, wherein the dielectric liner surrounds the semiconductor material;
forming a first gate and a second electrode in the second trench and vertically separated from each other;
forming a second gate and a third electrode in the third trench and vertically separated from each other;
forming a third gate and a fourth electrode in the fourth trench and vertically separated from each other; and
forming an interlayer dielectric layer to cover the first trench, the second trench, the third trench and the fourth trench.

15. The method of claim 14, further comprising:

performing a first etching process to form a first opening and a second opening in the interlayer dielectric layer and located directly above the first trench and the fourth trench, respectively; and performing a second etching process to remove a portion of the semiconductor material to form the first electrode, and to remove a portion of the third gate to increase a depth of the second opening.

16. The method of claim 15, further comprising:

performing a third etching process to remove a portion of the dielectric liner to form a recess in the first trench and to expand a width of the first opening, wherein a bottom surface of the recess is level with or lower than bottom surfaces of both the first body region and the second body region, and a top surface of the first electrode is higher than the bottom surface of the recess.

17. The method of claim 16, further comprising:

performing an ion implantation process on sidewalls of the first trench to form a first doped region and a second doped region both having the second conductivity type and located in the first body region and the second body region, respectively, wherein doping concentrations of the first doped region and the second doped region both are higher than doping concentrations of both the first body region and the second body region, and the first doped region and the second doped region are extended vertically along the sidewalls of the first trench.

18. The method of claim 17, further comprising:

filling the recess, the first opening and the second opening with a metal conductive material to form the source contact structure and a gate contact after the ion implantation process is performed, wherein a first portion of the source contact structure is located in the recess, a second portion of the source contact structure is located in the first opening, a width of the second portion is greater than a width of the first portion, and a bottom surface of the gate contact is located in the third gate.

19. The method of claim 13, wherein providing the substrate comprises:

forming a heavily doped region on a backside of the substrate, wherein the heavily doped region has the first conductivity type;

wherein the epitaxial layer is formed on the heavily doped region, the epitaxial layer has the first conductivity type, and a doping concentration of the heavily doped region is higher than a doping concentration of the epitaxial layer.

20. The method of claim 13, further comprising:

forming a drain electrode on a backside of the substrate; and forming a source electrode on a front side of the substrate and electrically connected to the source contact structure and the first electrode.

* * * * *